(12) United States Patent
Shindo et al.

(10) Patent No.: US 11,067,649 B2
(45) Date of Patent: Jul. 20, 2021

(54) METHOD FOR CREATING ELECTRON-BEAM HOLOGRAM, MAGNETIC FIELD INFORMATION MEASUREMENT METHOD AND MAGNETIC FIELD INFORMATION MEASURING DEVICE

(71) Applicant: TOHOKU UNIVERSITY, Sendai (JP)

(72) Inventors: Daisuke Shindo, Sendai (JP); Takafumi Sato, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 155 days.

(21) Appl. No.: 16/477,974

(22) PCT Filed: Jan. 12, 2018

(86) PCT No.: PCT/JP2018/000663
§ 371 (c)(1),
(2) Date: Jul. 15, 2019

(87) PCT Pub. No.: WO2018/139220
PCT Pub. Date: Aug. 2, 2018

(65) Prior Publication Data
US 2020/0124687 A1    Apr. 23, 2020

(30) Foreign Application Priority Data

Jan. 24, 2017   (JP) .............................. JP2017-009909

(51) Int. Cl.
*G01R 33/10* (2006.01)
*G01N 23/2251* (2018.01)
*G03H 5/00* (2006.01)

(52) U.S. Cl.
CPC ......... *G01R 33/10* (2013.01); *G01N 23/2251* (2013.01); *G03H 5/00* (2013.01)

(58) Field of Classification Search
CPC .. G01R 33/10; G01R 33/032; G01R 33/1284; G01R 33/12; G01N 23/2251; G03H 5/00; H01J 37/266; H01J 2237/2614
(Continued)

(56) References Cited

U.S. PATENT DOCUMENTS

2004/0061066 A1* 4/2004 Harada .................. H01J 37/26
                                                    250/396 ML

FOREIGN PATENT DOCUMENTS

JP     H04-206132 A    7/1992
JP     2966474 B2     10/1999
(Continued)

OTHER PUBLICATIONS

Park, Hyun Soon, et al. "Observation of the magnetic flux and three-dimensional structure of skyrmion lattices by electron holography." Nature nanotechnology 9.5 (2014): 337-342. (Year: 2014).*
(Continued)

*Primary Examiner* — Christopher P McAndrew
(74) *Attorney, Agent, or Firm* — Oliff PLC

(57) ABSTRACT

An object wave made of an electron beam influenced by a sample and reference beam made of an electron beam not influenced by the sample are made to interfere with each other where a magnetic field has been applied to the sample to create a first electron-beam hologram and create a first reconstructed phase image from the first electron-beam hologram. An object wave made of an electron beam influenced by the sample and a reference beam made of an electron beam not influenced by the sample are made to interfere where a magnetic field has not been applied to the sample to create a second electron-beam hologram and create a second reconstructed phase image from the second electron-beam hologram. Magnetic field information indicating the influence of the magnetic field on the sample is acquired on the basis of the difference between the first and second reconstructed phase images.

8 Claims, 9 Drawing Sheets

(58) Field of Classification Search
USPC .......................................................... 324/244
See application file for complete search history.

(56) References Cited

FOREIGN PATENT DOCUMENTS

| JP | 2002-117800 | A |   | 4/2002 |
|----|-------------|---|---|--------|
| JP | 2003-248910 | A |   | 9/2003 |
| JP | 2003-270312 | A |   | 9/2003 |
| JP | 2005-332772 | A |   | 12/2005 |
| JP | 2007-080724 | A |   | 3/2007 |
| JP | 2008-021626 | A |   | 1/2008 |
| JP | 2010-133741 | A |   | 6/2010 |
| JP | 2010133741  | A | * | 6/2010 |
| JP | 2014-216180 | A |   | 11/2014 |

OTHER PUBLICATIONS

Matsuda, Tsuyoshi, et al. "Magnetic field observation of a single flux quantum by electron-holographic interferometry." Physical review letters 62.21 (1989): 2519. (Year: 1989).*

Aug. 18, 2020 Office Action issued in Japanese Patent Application No. 2018-564473.
Daisuke Shindo. "Transmission electron microscope 3. Visualization function of electric field and magnetic field". Materia Japan, 44(11), 2005, pp. 932-935.
Daisuke Shindo, et al. "Electron Holographic Visualization of Collective Motion of Electrons Through Electric Field Variation". Microscopy and Microanalysis, vol. 20, pp. 1015-1021, 2014.
Naoyuki Kawamoto, et al. "Advanced Transmission Electron Microscopy on Silver-Based Conductive Adhesive". J. Japan Inst. Metals, vol. 70, No. 4, p. 384-388. 2006.
Takeshi Fujita. "Actual condition of an analysis method in electron holography" Materia Japan, vol. 45, No. 7, 2006, pp. 535-539.
"The world's first success in visualization of electron accumulation and its collective movement". National University Corporation Tohoku University, p. 1-8, 2014.
"Successful observation of electron accumulation on microfabricated insulator surface". National University Corporation Tohoku University, p. 1-6, 2016.
Apr. 3, 2018 International Search Report issued in International Patent Application No. PCT/JP2018/000663.
Jul. 30, 2019 International Preliminary Report on Patentablility issued in International Patent Application No. PCT/JP2018/000663.

* cited by examiner

METHOD FOR CREATING ELECTRON-BEAM HOLOGRAM, MAGNETIC FIELD INFORMATION MEASUREMENT METHOD AND MAGNETIC FIELD INFORMATION MEASURING DEVICE

FIELD OF THE INVENTION

The present invention relates to a method for creating an electron-beam hologram, a magnetic field information measurement method and a magnetic field information measuring device.

DESCRIPTION OF RELATED ART

Electron-beam holography is typically used to visualize nanoscale electric fields and magnetic fields in various materials (see, for example, Patent Literature 1 and Non-Patent Literature 1 or 2). More specifically, for example, the inventors of the present invention and others have used electron-beam holography to quantitatively analyze magnetic flux distributions in samples of ferrite magnets and Nd—Fe—B magnets and the charge distributions of toner particles (see, for example, Patent Literature 2). There have also been developed methods for visualizing magnetic fields that stray from samples made of magnetic materials and the magnetization distribution in magnetic materials using electron-beam holography (see, for example, Patent Literature 3 or 4).

The inventors of the present invention and others have succeeded in using electron-beam holography to visualize the state of electrons accumulating on the surface of an insulating material, such as a biological sample or an epoxy resin, by observing charge of the insulating material. More specifically, electron-beam holography is used to perform electron-beam irradiation, causing secondary electrons to be emitted from the insulating material and the insulating material to become positively charged. Increasing the strength of this electron-beam irradiation greatly increases the effect of charge, which causes the emitted secondary electrons to be brought back to and accumulate on the surface of the insulating material. Such a state is detected and visualized using an amplitude reconstructed image as an example of a disturbance in the electric field caused by movement of electrons (see, for example Non-Patent Literature 3 to 5).

The inventors of the present invention and others have developed a high-performance magnetic field application device that can increase the magnetic field application correction angle and the strength of magnetic field application without the need to increase the size of the device (see, for example, Patent Literature 5). This device acts as a magnetic field application device that can apply a magnetic field to a sample with a transmission electron microscope, which is also used in electron-beam holography. The inventors of the present invention and others have also developed a double-probe piezodriving holder that allows multiple probe operation in order to comprehensively evaluate magnetic, conductive and crystallographic microstructures in transmission electron microscopes (see, for example, Non-Patent Literature 6).

CITATION LIST

Patent Literature 1: JP-A-2966474
Patent Literature 2: JP-A-2008-21626
Patent Literature 3: JP-A-2003-248910
Patent Literature 4: JP-A-2003-270312
Patent Literature 5: JP-A-2007-80724
Non-Patent Literature 1: D. Shindo, "Transmission Electron Microscope: 3. Function of Visualization of Electric and Magnetic Fields," Materia Japan 44(11), 2005, pp. 932-935
Non-Patent Literature 2: T. Fujita, "Practical Image Processing for Electron Holography," Materia Japan 45(7), 2006, pp. 535-539
Non-Patent Literature 3: Tohoku University Press Release, May 13, 2014, "First to Visualize Charge Storage and Collective Movement of Electrons—Detecting and Tracking Disturbance of Electric Field Due to Electron Movement Using State-of-the-art Measurement Method"
Non-Patent Literature 4: D. Shindo, et. al., "Electron Holographic Visualization of Collective Motion of Electrons Through Electric Field Variation", Microscopy and Microanalysis, 2014 August, Vol. 20, Issue 4, pp. 1015-1021
Non-Patent Literature 5: Tohoku University Press Release, Jun. 7, 2016, "Successfully Viewed Electron Storage on Surface of Microfabricated Insulating material—Visualizing with Electron Beam Holography as State-of-the-art Electromagnetic Field Measurement Method-"
Non-Patent Literature 6: N. Kawamoto, et. al., "Advanced Transmission Electron Microscopy on Silver-Based Conductive Adhesive," J. Japan Inst. Metals, Vol. 70, No. 4 (2006), pp. 384-388

SUMMARY OF THE INVENTION

As described in Patent Literature 1 to 4 and Non-Patent Literature 1 to 5, electron-beam holography has been used to visualize electrical fields and magnetic fields and the movement of electrons due to charge. However, analyzing how a magnetic field applied to a sample influences electrons in the sample or on the surface of the sample cannot yet be visualized or evaluated.

The present invention has been made while focusing on this problem, and it is an object of the present invention to provide a method for creating an electron-beam hologram, a magnetic field information measurement method and a magnetic field information measuring device with which the influence magnetic field application has on electrons in a sample or on the surface of a sample can be visualized and evaluated.

In order to achieve this object, a method for creating an electron-beam hologram according to the present invention is characterized in that an object wave comprised of an electron beam that is influenced by a sample is made to interfere with a reference beam comprised of an electron beam that is not influenced by the sample under a state where a magnetic field has been applied to the sample to create an electron-beam hologram.

The method for creating an electron-beam hologram according to the present invention can create an electron-beam hologram including influence of magnetic field application on the surface of a sample or electrons in a sample because an electron-beam hologram is created under a state where a magnetic field is applied to the sample. Through using the created electron-beam hologram, the influence of magnetic field application on the surface of a sample or electrons in a sample can be visualized and evaluated. The magnetic field application device described in Patent Literature 5, for example, can be used to apply the magnetic field to the sample.

A magnetic field information measurement method according to the present invention is characterized by including a first reconstructed phase image creation step of creating a first reconstructed phase image from a first electron-beam hologram that is created by causing an object wave comprised of an electron beam that is influenced by a sample and a reference beam comprised of an electron beam that is not influenced by the sample to interfere with each other under a state where a magnetic field has been applied to the sample; a second reconstructed phase image creation step of creating a second reconstructed phase image from a second electron-beam hologram that is created by causing an object wave comprised of an electron beam that is influenced by a sample and a reference beam comprised of an electron beam that is not influenced by the sample to interfere with each other under a state where a magnetic field has not been applied to the sample; and a magnetic field information acquisition step of obtaining magnetic field information indicating influence of the magnetic field on the sample on the basis of a difference between the first reconstructed phase image and the second reconstructed phase image.

A magnetic field information measuring device according to the present invention is characterized by including electron-beam hologram creation means provided to create an electron-beam hologram by causing an object wave comprised of an electron beam that is influenced by a sample and a reference beam comprised of an electron beam that is not influenced by the sample to interfere with each other; magnetic field application means provided to apply a magnetic field to the sample; and magnetic field information acquisition means provided to create a first reconstructed phase image from the first electron-beam hologram created using the electron-beam hologram creation means under a state where a magnetic field has been applied to the sample using the magnetic field application means, create a second reconstructed phase image from a second electron-beam hologram created using the electron-beam hologram creation means under a state where a magnetic field is not applied to the sample, and determine the difference between the first reconstructed phase image and the second reconstructed phase image to acquire magnetic field information indicating influence of the magnetic field on the sample.

The magnetic field information measuring device according to the present invention can suitably perform the magnetic field information measurement method according to the embodiment of the present invention. The magnetic field information measurement method according to the present invention can visualize the influence of magnetic field application on the surface of a sample or electrons in a sample on the basis of the following principle, for example. First, as illustrated in FIG. 1(a), a sample 1 including a material that emits secondary electrons when irradiated with an electron beam (for example, an insulating material) is irradiated with an electron beam to create an electron-beam hologram. Then, secondary electrons 2 are emitted from the sample 1. As a result, as illustrated in FIG. 1(b), the sample 1 becomes positively charged and the effect of this charge causes the emitted secondary electrons 2 to be brought back to and stored on the surface of the sample 1.

At this time, if no magnetic field has been applied to the sample 1, the spin (indicated by the arrows in the figures) of the secondary electrons 2 is randomly orientated as illustrated in FIG. 1(b). In contrast, if a relatively weak magnetic field 3 has been applied to the sample 1, the spin of the secondary electrons 2 changes from the random state to being aligned in the direction in which the magnetic field 3 has been applied, as illustrated in FIG. 1(c). If a strong magnetic field 3 has been applied to the sample 1, the spin of the secondary electrons 2 is orientated so as to be aligned along the direction in which the magnetic field 3 has been applied while dipolar interaction occurs, as illustrated in FIG. 1(d).

As a result, by determining the difference between the first reconstructed phase image created under a state where a magnetic field has been applied to the sample and the second reconstructed phase image created under a state where a magnetic field has not been applied to the sample, it is possible to only extract the influence caused by the spin aligning with the direction in which the magnetic field is applied, among the influence of secondary electrons on the phase of the electron beam of the object wave. As a result, the influence of magnetic field application on secondary electrons can be visualized as magnetic field information. In addition, the relative rate of change of magnetic flux density caused by secondary electrons can also be obtained as further magnetic field information from the visualized magnetic field information.

FIG. 1 illustrates a case where the sample emits secondary electrons, but the sample may not emit secondary electrons and the influence of the magnetic field on both the sample and electrons in the sample can still be visualized on the basis of the same principle. Further, the influence of magnetic field application on the surface of a sample or the electrons in a sample can be evaluated on the basis of the visualized magnetic field information.

As described above, in the magnetic field information measurement method according to the present invention, information indicating the influence of the magnetic field on electrons in the sample may be acquired as the magnetic field information in the magnetic field information acquisition step. Further, in the magnetic field information measurement method according to the present invention, the sample may include a material that emits secondary electrons when irradiated with an electron beam and, in the first reconstructed phase image creation step and the second reconstructed phase image creation step, the sample may be irradiated with an electron beam to emit secondary electrons from the sample and the electron beam that passes through the sample is made to interfere with the reference wave as the object wave, and, in the magnetic field information acquisition step, information indicating the influence of the magnetic field on the secondary electrons emitted from the sample is acquired as the magnetic field information.

In the magnetic field information measurement method according to the present invention, in the magnetic field information acquisition step, information indicating the spin movement of the electrons in the sample or the secondary electrons emitted from the sample may be acquired as the magnetic field information In the magnetic field information measurement method according to the present invention, the sample that emits secondary electrons when irradiated with an electron beam is preferably made of an insulating material. The insulating material is, for example, an inorganic material such as a biomaterial, an epoxy resin, a quartz glass or a dielectric material. The magnetic field application device described in Patent Literature 5, for example, can be used to apply the magnetic field to the sample.

According to the present invention, there can be provided a method for creating an electron-beam hologram, a magnetic field information measurement method and a magnetic field information measuring device with which the influence of magnetic field application on electrons in a sample or on the surface of a sample can be visualized and evaluated.

BRIEF DESCRIPTION OF THE DRAWINGS

FIG. 1(a) illustrates a state where electron beam irradiation causes secondary electrons to be emitted from a sample; FIG. 1(b) illustrates a state where a sample is positively charged and secondary electrons accumulate on the surface of the sample; FIG. 1(c) illustrates a state where the spin of secondary electrons is orientated so as to be aligned with a direction in which a weak magnetic field is applied; and FIG. 1(d) illustrates a state where the spin of secondary electrons is orientated so as to be aligned with a direction in which a strong magnetic field is applied.

FIG. 4(a) illustrates a grid for a transmission electron microscope, FIG. 4(b) illustrates arrangement of a sample, and FIG. 4(c) is an enlarged view of one hole in FIG. 4(a).

FIG. 5(a) illustrates reconstructed phase images when a magnetic field of −4 mT (tesla) is applied, reconstructed phase images when no magnetic field (0 mT) is applied, and reconstructed phase images when a magnetic field of +4 mT is applied; and FIG. 5(b) illustrates phase difference images that indicate the difference between each reconstructed phase image when a magnetic field of −4 mT is applied and a reconstructed phase image when no magnetic field is applied, and the difference between each reconstructed phase image when a magnetic field of +4 mT is applied and a reconstructed phase image when no magnetic field is applied.

FIG. 6(a) illustrates a state where electron beam irradiation causes secondary electrons to be emitted from a sample; FIG. 6(b) illustrates a state where a sample is positively charged and secondary electrons accumulate on the surface of the sample; FIG. 6(c) illustrates a state where the spin of secondary electrons is orientated so as to be aligned with a direction in which a magnetic field is applied; and FIG. 6(d) illustrates a state where secondary electrons with aligned spin are injected into a semiconductor or a magnetic material.

DETAILED DESCRIPTION OF THE INVENTION

An embodiment of the present invention is described below with reference to the drawings.

FIGS. 2 to 9 illustrate a method for creating an electron-beam hologram, a magnetic field information measurement method and a magnetic field information measuring device according to the embodiment of the present invention.

Figure 2:
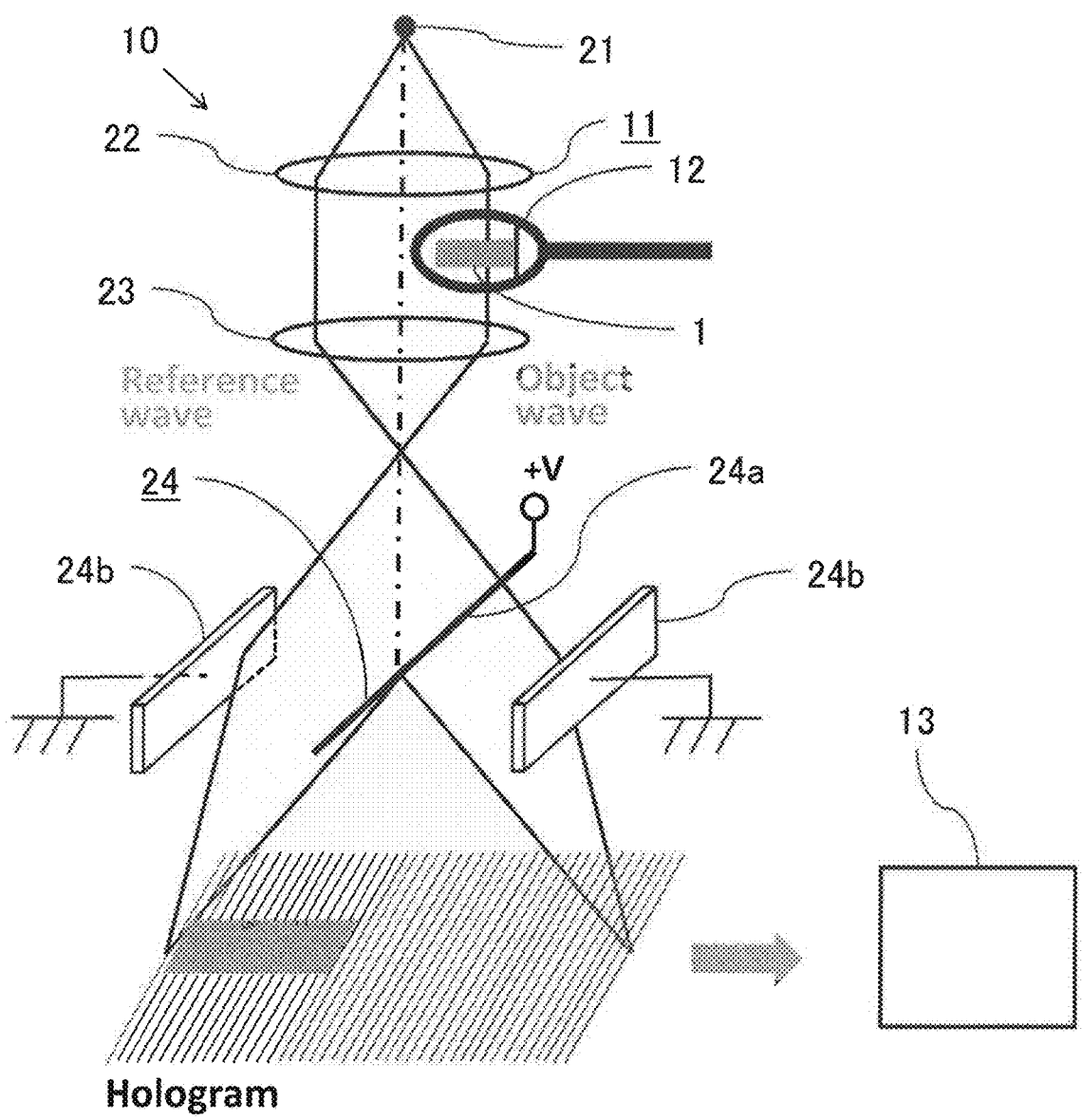
FIG. 2 is a perspective view for illustrating a magnetic field information measuring device according to an embodiment of the present invention.

As illustrated in FIG. 2, a magnetic field information measuring device 10 according to the embodiment of the present invention includes electron-beam hologram creation means 11, magnetic field application means 12 and magnetic field information acquisition means 13.

The electron-beam hologram creation means 11 is an electron-beam holography device that uses a 300 kV electron microscope and includes an electron beam source 21, a condenser lens 22, an objective lens 23 and a biprism 24. The electron beam source 21 can irradiate an electron beam. The condenser lens 22 is provided such that the electron beam irradiated from the electron beam source 21 passes through the condenser lens 22 and becomes a collimated beam. The objective lens 23 is disposed parallel to the condenser lens 22 a predetermined interval from the objective lens 23 and is configured to focus the collimated electron beam that has passed through the condenser lens 22.

The biprism 24 includes a quartz glass wire 24a that is deposited with a conductive film and a pair of ground electrodes 24b. The quartz glass wire 24a is disposed so as to lay across the center of the electron beam flux after the electron beam has been focused by the objective lens 23. The quartz glass wire 24a is configured to be applied with an electric field and be grounded. The ground electrodes 24b are disposed facing each other so as to be parallel to the quartz glass wire 24a and sandwich the quartz glass wire 24a. Each ground electrode 24b is configured to tailor the electric field generated in the quartz glass wire 24a.

Due to this configuration, the electron-beam hologram creation means 11 uses the condenser lens 22 to collimate the electron beam that is irradiated from the electron beam source 21. Part of the collimated electron beam becomes an object wave that is irradiated on a sample 1 and influenced by the sample 1. After the object wave is focused using the objective lens 23 together with a reference wave that is not influenced by the sample 1, the waves enter the biprism 24 and are made to interfere with each other to create interference fringes (an electron-beam hologram; a hologram).

For example, the electron-beam hologram creation means 11 converts the obtained electron-beam hologram into digital image data and sends the digital image data to the magnetic field information acquisition means 13.

The magnetic field application means 12 is configured to apply a magnetic field to the sample 1 to be irradiated with an electron beam. The magnetic field application means 12 is, for example, the magnetic field application device described in Patent Literature 5.

The magnetic field information acquisition means 13 is a computer and is configured to acquire image data of the electron-beam hologram created by the electron-beam hologram creation means 11 and perform various types of analytical processing. The magnetic field information acquisition means 13 is configured to Fourier transform the image data of the electron-beam hologram, extract information on the electromagnetic field recorded in the interference fringes and obtain a reconstructed phase image.

Figure 3:
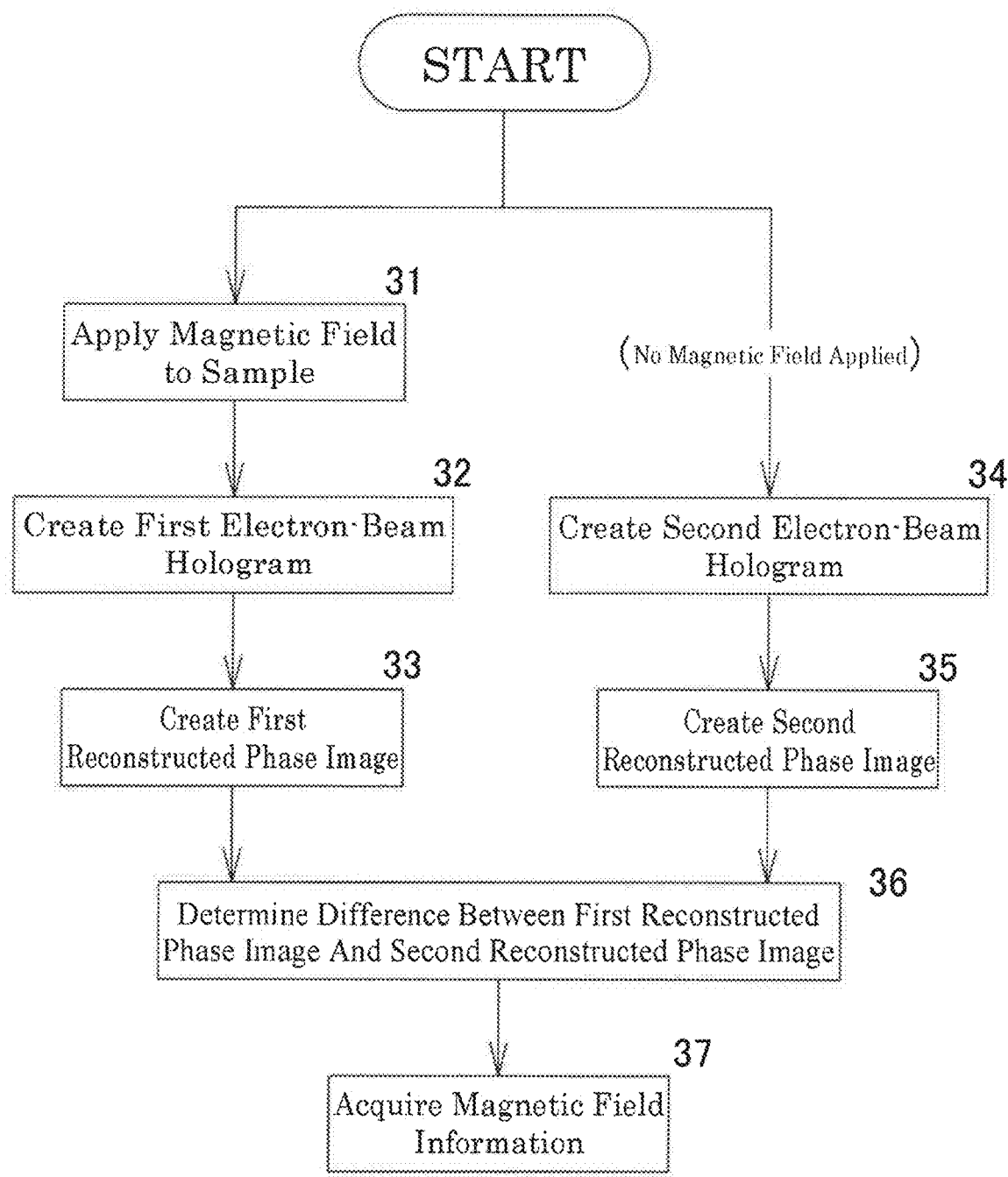
FIG. 3 is a flowchart for illustrating a magnetic field information measurement method according to the embodiment of the present invention.

The magnetic field information measuring device 10 can suitably perform the magnetic field information measurement method according to the embodiment of the present invention. In other words, as illustrated in FIG. 3, the magnetic field information measurement method according to the embodiment of the present invention involves first applying a magnetic field to the sample 1 using the magnetic field application means 12 (Step 31), then, in that state, using the electron-beam hologram creation means 11 to cause an object beam comprised of an electron beam influenced by the sample 1 and a reference beam comprised of an electron beam not influenced by the sample 1 to interfere with each other to create a first electron-beam hologram (Step 32), and finally using the magnetic field information acquisition means 13 to create a first reconstructed phase image from the first electron-beam hologram (Step 33).

Then, in a similar manner, with no magnetic field applied to the sample 1, the electron-beam hologram creation means 11 is used to cause the object beam comprised of an electron beam influenced by the sample 1 and the reference beam comprised of an electron beam not influenced by the sample 1 to interfere with each other to create a second electron-beam hologram (Step 34). Then, the magnetic field information acquisition means 13 is used to create a second reconstructed phase image from the second electron-beam hologram (Step 35). In addition, the magnetic field information acquisition means 13 is used to determine the difference between the created first reconstructed phase image and second reconstructed phase image (Step 36) and obtain magnetic field information indicating the influence of the magnetic field on the sample 1 on the basis of the difference (Step 37).

With the magnetic field information measurement method and the magnetic field information measuring device 10 according to the embodiment of the present invention, an electron-beam hologram is created without a magnetic field being applied to the sample 1. Therefore, an electron-beam hologram that includes the influence of magnetic field application on the surface of the sample 1 or the electrons in the sample 1 can be created. In addition, by determining the difference between the first reconstructed phase image created with a magnetic field applied to the sample 1 and the second reconstructed phase image created with no magnetic field applied to the sample 1, it is possible to extract and visualize only the influence of magnetic field application on the surface of the sample 1 or the electrons in the sample 1. The visualized magnetic field information can also be used to evaluate the influence of magnetic field application on the surface of the sample 1 or the electrons in the sample 1.

Example 1

Figure 4:
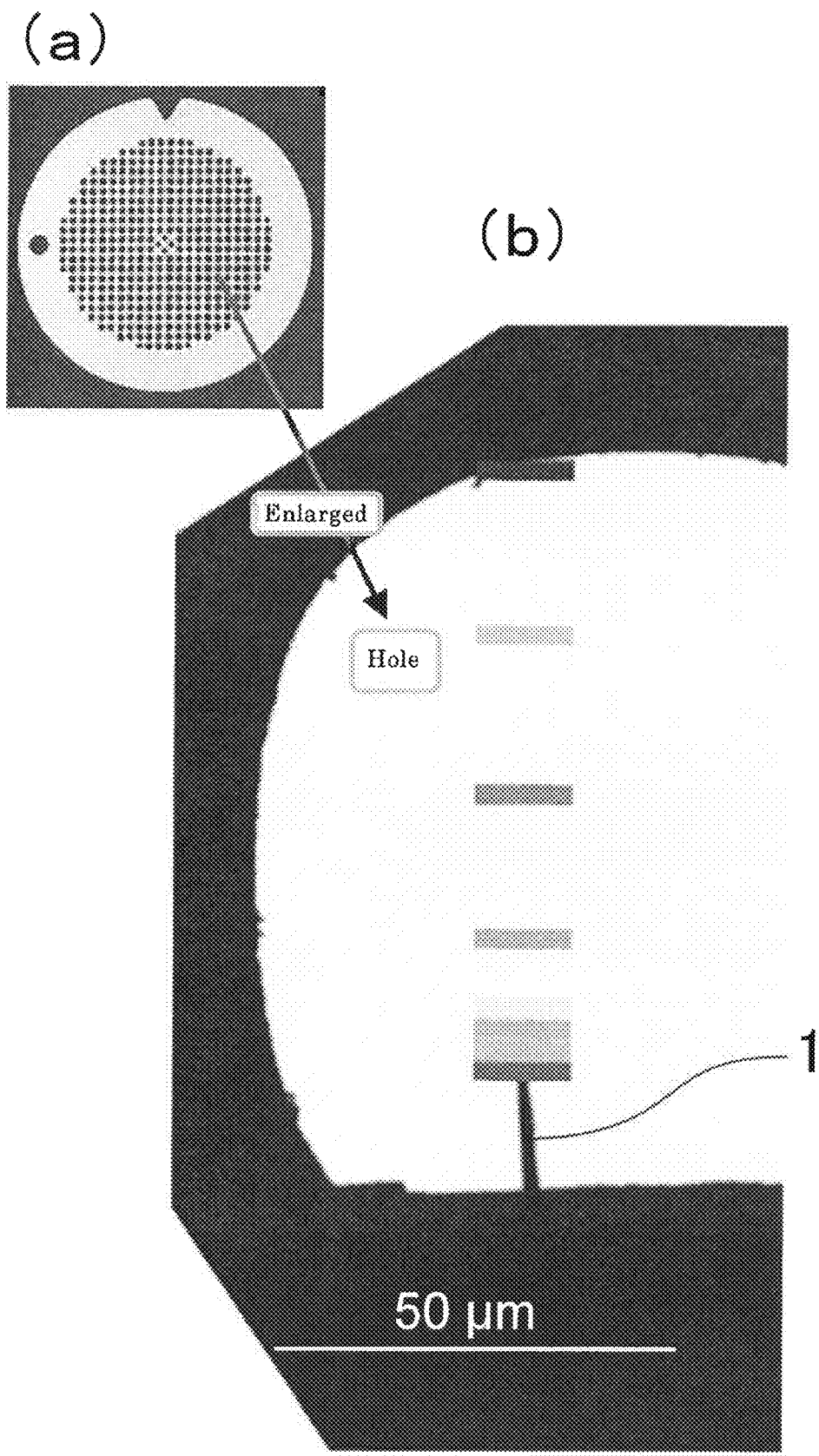
FIG. 4 are examples of experiments with the magnetic field information measurement method and the magnetic field information measuring device according to the embodiment of the present invention, where
Figure 5:
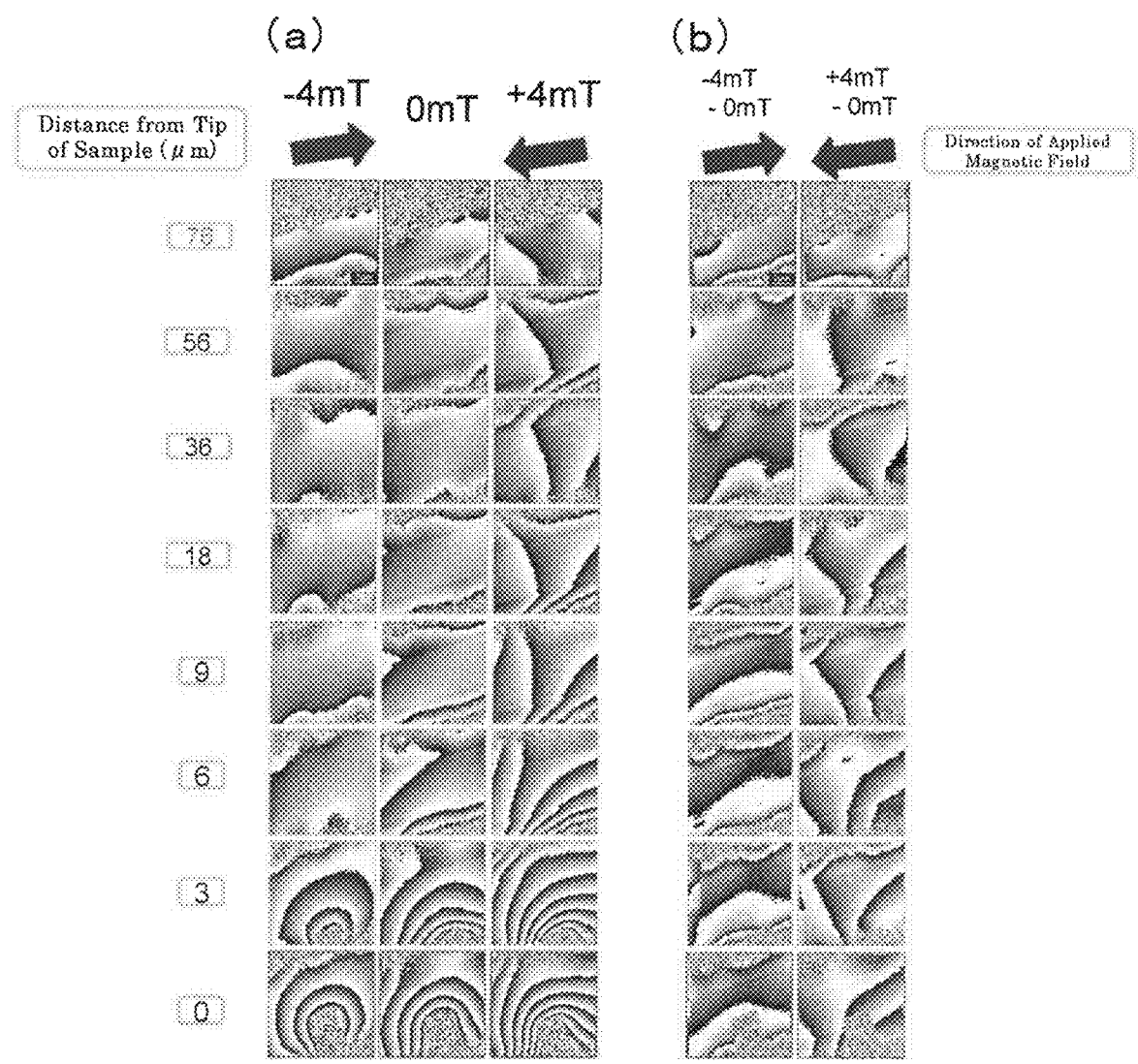
FIG. 5 illustrate results of an experiment using the magnetic field information measurement method and the magnetic field information measuring device according to the embodiment of the present invention, for different distances from the tip of the sample 1 illustrated in FIG. 4(b), where

An experiment for obtaining magnetic field information that indicates the influence of a magnetic field on the sample 1 was conducted using the magnetic field information measurement method and the magnetic field information measuring device 10 according to the embodiment of the present invention. An insulating material made of epoxy resin that emits secondary electrons when irradiated with an electron beam was used as the sample 1. First, as illustrated in FIG. 4, a transmission electron microscope grid formed with 3 mm diameter holes at predetermined intervals along vertical and horizontal directions was used. The tip of a 1 µm diameter rod-shaped sample 1 made of epoxy resin was disposed in one of the holes.

Then, the magnetic field information measuring device 10 illustrated in FIG. 2 was used to irradiate an electron beam on the tip of the sample 1 and acquire an electron-beam hologram to create reconstructed phase images. The obtained reconstructed phase images are illustrated in FIG. 5(a). FIG. 5(a) illustrates a reconstructed phase image obtained when a −4 mT magnetic field was applied (first reconstructed phase image), a reconstructed phase image obtained when no magnetic field was applied (0 mT) (second reconstructed phase image) and a reconstructed phase image obtained when a +4 mT magnetic field was applied (first reconstructed phase image) for different distances from the tip of the sample 1 illustrated in FIG. 4(b). In FIG. 5(a), the direction in which the magnetic field is applied is indicated by arrows.

For each obtained reconstructed phase image and for each distance from the tip of the sample (epoxy) 1, the difference (−4 mT-0 mT) between each reconstructed phase image when a −4 mT magnetic field is applied (first reconstructed phase images) and the reconstructed phase image when no magnetic field is applied (second reconstructed phase image), and the difference between each reconstructed phase image when a +4 mT magnetic field is applied (first reconstructed phase images) and the reconstructed phase image when no magnetic field is applied (second reconstructed phase image) are determined, and these differences are illustrated in FIG. 5(b). In FIG. 5(b), the direction in which the magnetic field is applied is indicated by arrows. As illustrated in FIG. 5(b), a pattern that extends along the direction in which the magnetic field is applied was confirmed.

Figure 1:
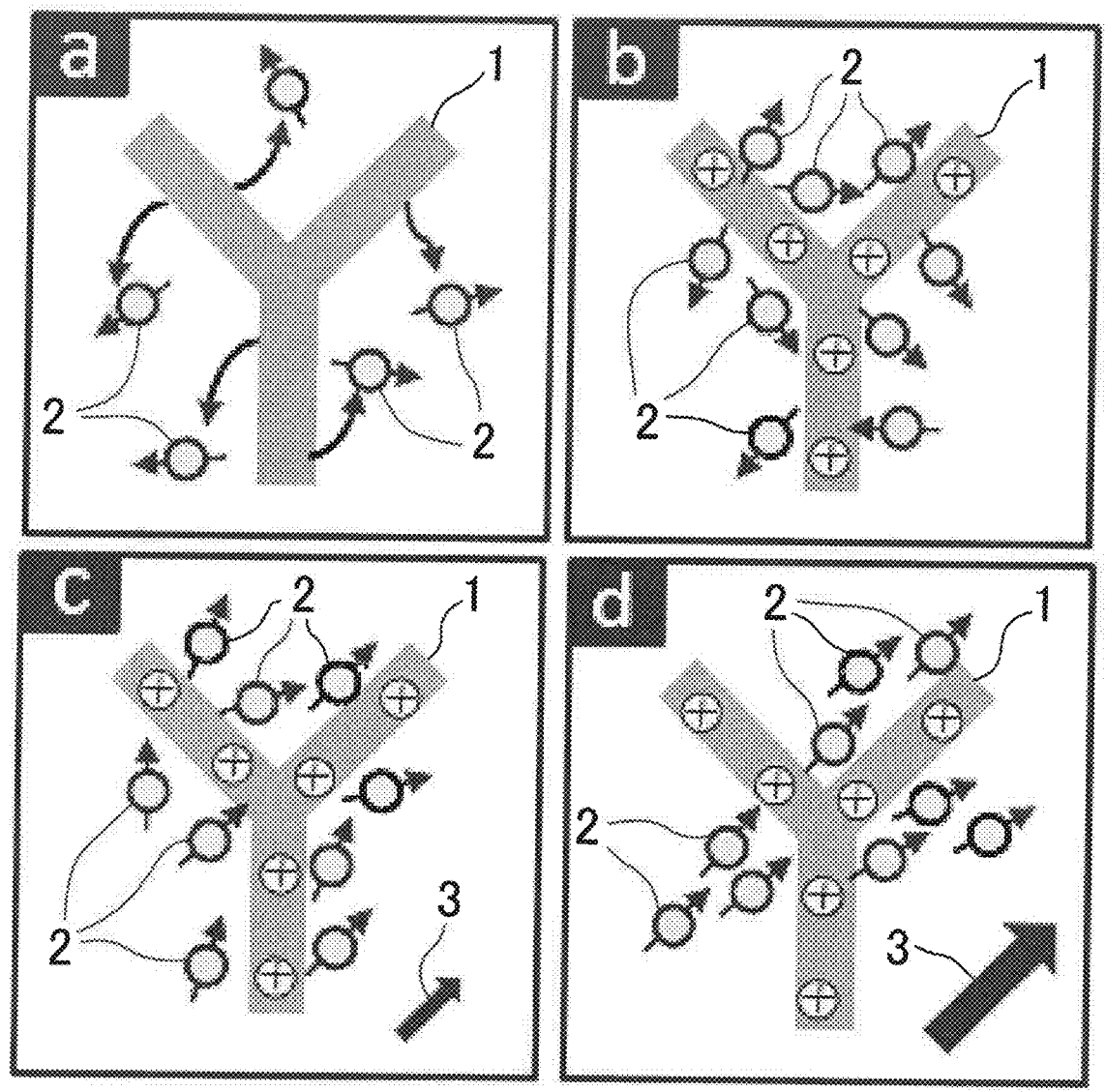
FIG. 1 are schematic diagrams for illustrating the principle of the magnetic field information measurement method according to the present invention, where

Based on the principle shown in FIG. 1, the results illustrated in FIG. 5(b) indicate that a state where the spin of secondary electrons emitted from the sample 1 made of epoxy resin is orientated so as to be aligned with the direction in which the magnetic field is applied while dipolar interaction occurs was directly observed as magnetic flux. In this experiment, information indicating the spin movement of secondary electrons emitted from the sample 1 was obtained as the magnetic field information and, with the magnetic field information measurement method and the magnetic field information measuring device 10 according to the embodiment of the present invention, the influence of magnetic field application on the secondary electrons can be visualized and evaluated.

Example 2

Figure 6:
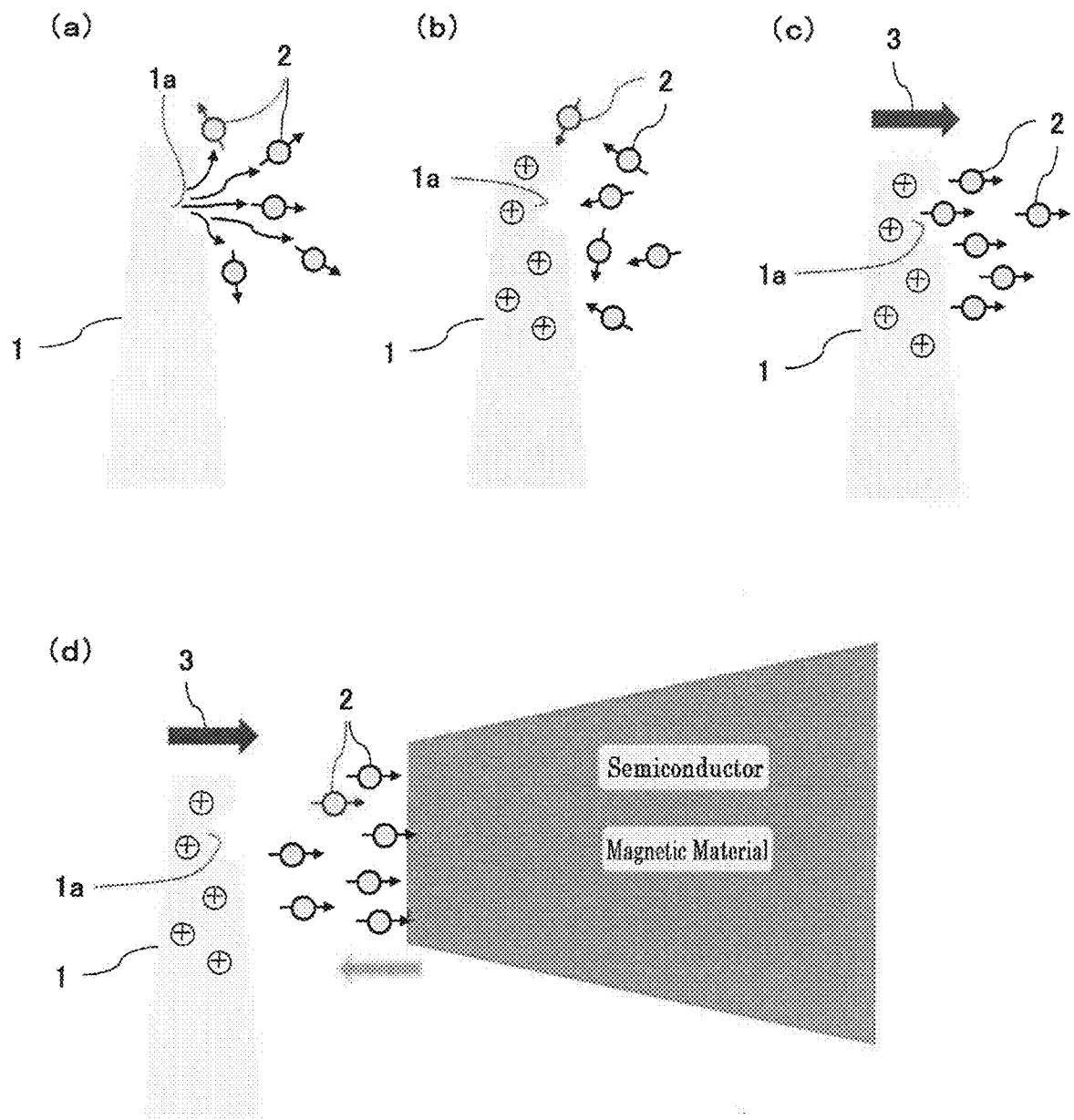
FIG. 6 illustrate the principle of spin injection in which observation is performed with the magnetic field information measurement method and the magnetic field information measuring device according to the embodiment of the present invention, where

An experiment for observing the injection of spinning electrons orientated in the direction in which the magnetic field is applied into a semiconductor or a magnetic material, that is, spin injection was conducted using the magnetic field information measurement method and the magnetic field information measuring device 10 according to the embodiment of the present invention. The principle of the spin injection to be observed is shown in FIG. 6. As illustrated in FIG. 6(a), an insulating material that emits secondary electrons when irradiated with an electron beam was used as the sample 1 and a tip portion of the sample 1 was formed into a hooked shape with a recess 1a using focused ion beam (FIB) machining. By forming the tip portion into a hooked shape, spin can be more easily concentrated at the recess 1a and spin injection can be performed more easily.

As illustrated in FIG. 6(a), when an electron beam for creating an electron-beam hologram is irradiated on the sample 1, secondary electrons 2 are emitted from the sample 1. As a result, as illustrated in FIG. 6(b), the sample 1 becomes positively charged and the effect of this charge causes the emitted secondary electrons 2 to be brought back to and accumulate on the surface of the sample 1. If no magnetic field has been applied to the sample 1 at this time, as illustrated in FIG. 6(b), the spin (arrows in FIG. 6) of the secondary electrons 2 is randomly orientated. As illustrated in FIG. 6(c), when a magnetic field 3 is applied to the sample 1, the spin of the secondary electrons 2 changes from a random state to being aligned in the direction in which the magnetic field 3 is applied. At this time, the secondary electrons 2 with aligned spin become concentrated particularly in the recess 1a of the sample 1. In addition, an uneven magnetic field distribution caused by electrons is formed on the surface of the sample 1 and dipolar interaction among other phenomena occur due to the spin of the secondary electrons 2. Under this state, the semiconductor or magnetic material approaches the recess 1a of the sample 1 and, as a result, the secondary electrons 2 with aligned spin can be injected into the semiconductor or magnetic material, as illustrated in FIG. 6(d).

Figure 7:
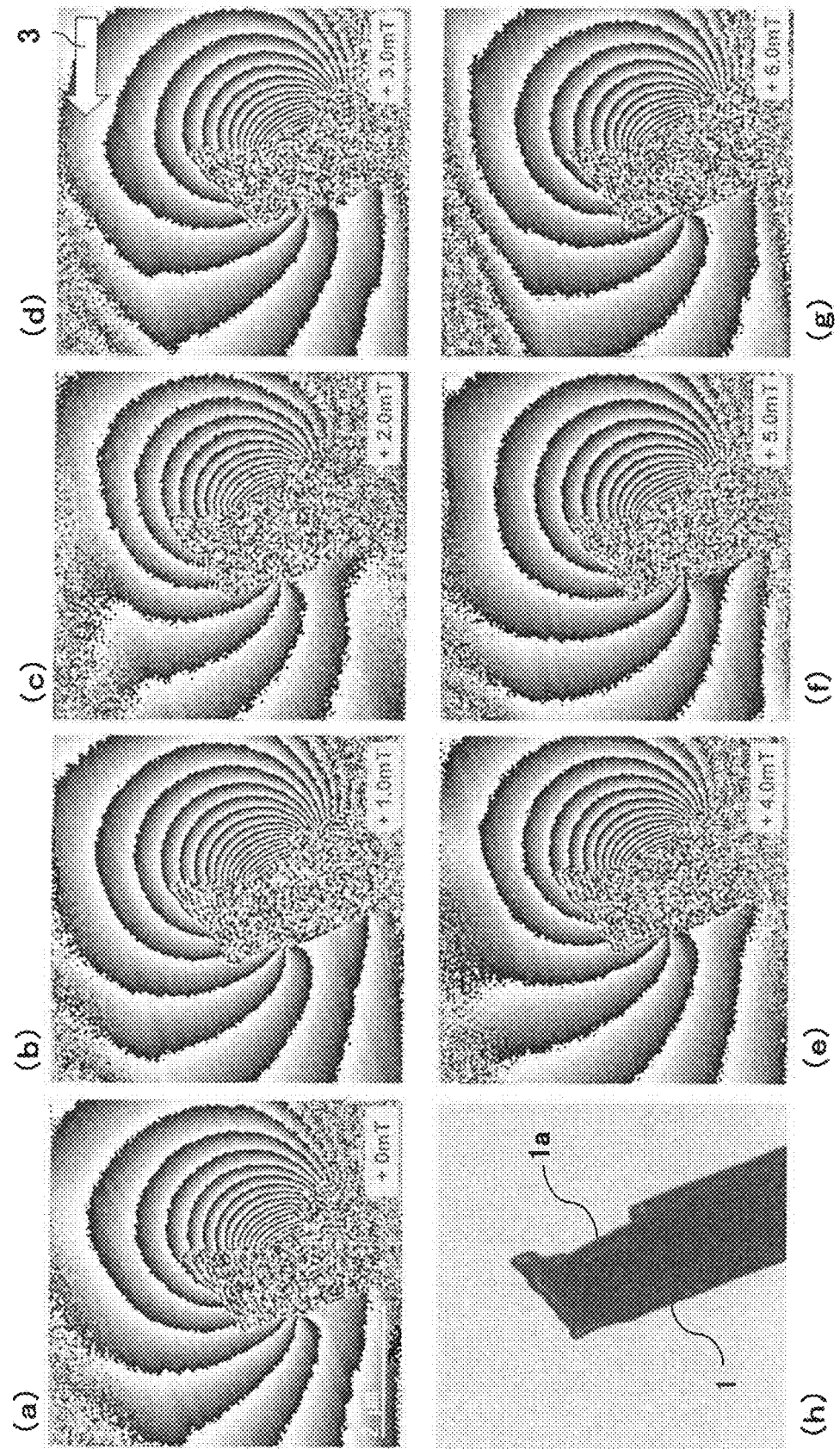
FIGS. 7(a) to 7(g) are reconstructed phase images taken after performing an experiment with the magnetic field information measurement method and the magnetic field information measuring device according to the embodiment of the present invention when a magnetic field of (a) 0 mT (no magnetic field); (b) 1.0 mT; (c) 2.0 mT; (d) 3.0 mT; (e) 4.0 mT; (f) 5.0 mT; and (g) 6.0 mT is applied.
FIG. 7(h) illustrates photographs of samples taken with a transmission electron microscope when the samples are arranged at the same positions as in FIGS. 7(a) to (g), respectively.
Figure 8:
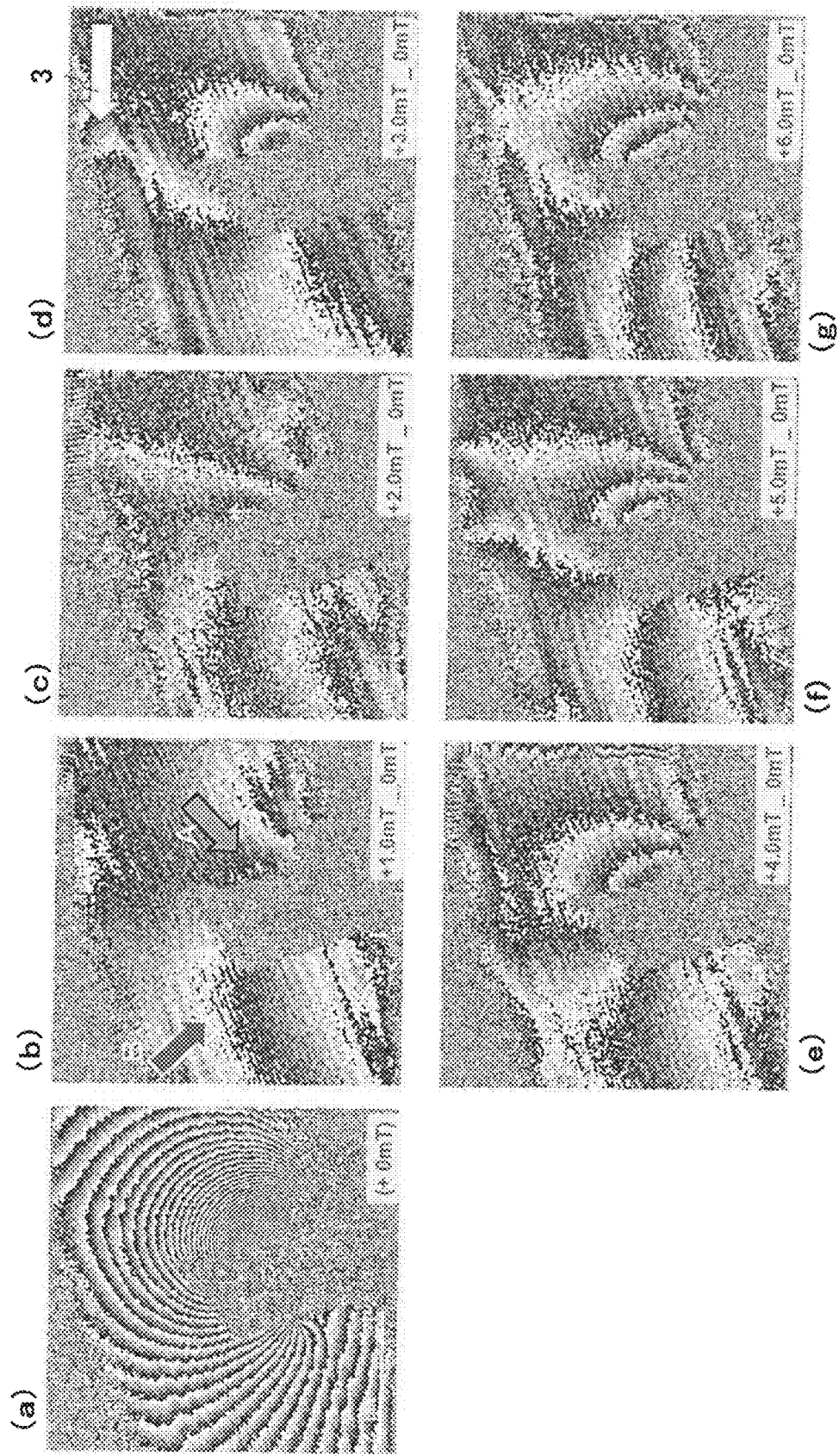
FIG. 8(a) is reconstructed phase image of FIG. 7(a) amplified 3×.
FIGS. 8(b) to 8(g) are reconstructed phase images amplified 3×, which are obtained by subtracting the reconstructed phase image taken when no magnetic field is applied (the reconstructed phase image in FIG. 7(a)) from the reconstructed phase images in FIGS. 7(b) to 7(g), respectively.

Based on the principle shown in FIG. 6, the magnetic field information measuring device 10 illustrated in FIG. 2 was used to irradiate the tip of the sample 1 with an electron beam to acquire an electron-beam hologram and create reconstructed phase images. In this experiment, mica was used as the insulating material sample 1. The obtained reconstructed phase images are shown in FIGS. 7 and 8. FIGS. 7(a) to (g) illustrate reconstructed phase images when a 0 mT magnetic field 3 (no magnetic field) is applied, a 1.0 mT magnetic field 3 is applied, a 2.0 mT magnetic field 3 is applied, a 3.0 mT magnetic field 3 is applied, a 4.0 mT magnetic field 3 is applied, a 5.0 mT magnetic field 3 is applied and a 6.0 mT magnetic field 3 is applied, respectively. The directions in which the magnetic fields 3 are applied are shown in FIG. 7(d). FIG. 7(h) illustrates photographs of the sample 1 taken with a transmission electron microscope at the same positions as those in FIGS. 7(a) to (g). FIGS. 7(b) to (g) illustrate first reconstructed phase images in which the magnetic field 3 was applied and FIG. 7(a) illustrates a second reconstructed phase image taken when the magnetic field 3 was not applied.

FIG. 8(a) illustrates reconstructed phase image of FIG. 7(a) amplified 3×, and FIGS. 8(b) to (g) illustrate reconstructed phase images amplified 3× obtained by subtracting the reconstructed phase image taken when the magnetic field 3 is not applied (the second reconstructed phase image in FIG. 7(a)) from the reconstructed phase images illustrated in FIGS. 7(b) to (g), respectively. The direction in which the magnetic field 3 was applied is shown in FIG. 8(d).

As illustrated in FIGS. 7(a) to (g), an increase in strength of charge can be confirmed in the recess 1a of the sample 1. As illustrated in FIGS. 8(b) to (g), it can be confirmed that the electric field changes due to secondary electrons concentrating around the recess 1a of the sample 1 (the area indicated by the arrow A in FIG. 8(b)) as a result of the applied magnetic field becoming stronger. At areas other than the recess 1a (for example, the area indicated by the arrow B in FIG. 8(b)), there was detected a relative change in magnetic flux density due to the applied magnetic field becoming stronger.

In this state, the secondary electrons with aligned spin can be injected into the semiconductor or magnetic material because the semiconductor or magnetic material approaches the charged insulating material sample. A state where the secondary electrons with aligned spin are injected into the semiconductor or magnetic material can be observed using the double-probe piezodriving holder described in Non-Patent Literature 6. Based on the results of this experiment, spin injection could be directly observed using the magnetic field information measurement method and the magnetic field information measuring device 10 according to the embodiment of the present invention.

Next, based on the flowchart illustrated in FIG. 3, a relative rate of change of magnetic flux density caused by secondary electrons near the insulating material sample (the area indicated by the arrow B) in FIG. 8(b) was determined from the reconstructed phase images illustrated in FIGS. 8(b) to (g). Assuming that the interval between interference fringes in the reconstructed phase image is l (m), the average width of the sample 1 is t (m), and the magnetic flux is φ (Wb), the relative rate of change of magnetic flux density B (T) is $$B = 4.1 \times 10^{-15}/(l \times t \times n) \quad (1)$$

where h is a Planck constant, e is elementary charge, and n is a phase amplification value, with $\phi = l \times t \times B = h/e = 4.1 \times 10^{-5}$ (Wb).

From FIGS. 8(b) to (g), it can be confirmed that the interval l between interference fringes when the applied magnetic field is 1.0 mT, 2.0 mT, 3.0 mT, 4.0 mT, 5.0 mT and 6.0 mT is 2.0 μm, 1.9 μm, 1.8 μm, 1.6 μm, 1.3 μm and 1.0 μm, respectively. From these intervals l between interference fringes, the relationship between the applied magnetic field when the average thickness t of the sample 1 is from 1.0 μm to 4.0 μm and the relative rate of change B of magnetic flux is determined using Equation (1) and shown in FIG. 9. In this case, n=3.

Figure 9:
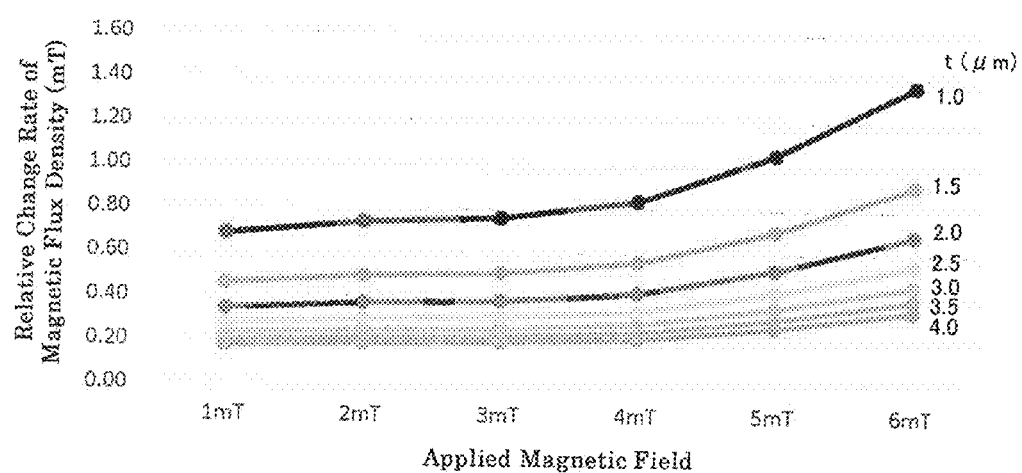
FIG. 9 is a graph showing the relationship between applied magnetic field and relative rate of change of magnetic flux density obtained from the reconstructed phase images in FIGS. 8(b) to 8(g).

As illustrated in FIG. 9, it was confirmed that the relative rate of change B of magnetic flux caused by secondary electrons increased as the applied magnetic field increased, regardless of the average thickness t of the sample 1. For example, when the average thickness of the sample 1 was 3.0 μm, the rate of change B of magnetic flux in the area indicated by the arrow B when the applied magnetic field was +1.0 mT (corresponds to FIG. 8(b)) was approx. 0.23 mT. When the applied magnetic field increased, the interval l between interference fringes decreased and the relative rate of change B of magnetic flux gradually increased. When the applied magnetic field was +3.0 mT (corresponds to FIG. 8(d)), the relative rate of change B of magnetic flux in the area indicated by the arrow B was approx. 0.28 mT. If the applied magnetic field increased further, the relative rate of change B of magnetic flux rapidly increased and, when the applied magnetic field was +6.0 mT (corresponds to FIG. 8(g)), the relative rate of change B of magnetic flux in the area indicated by the arrow B was approx. 0.46 mT.

With the magnetic field information measurement method and the magnetic field information measuring device 10 according to the embodiment of the present invention, the distribution of spin of electrons (secondary electrons) near the surface of a sample can be directly observed and the relative rate of change of magnetic flux that is caused by these electrons can also be determined. In contrast, in measurement using traditional spin-polarized scanning tunneling microscopy (spin-polarized STM), spin-polarized scanning tunneling microscopy (SP-STM) or the magnetic Kerr effect (Kerr), while magnetic domains on the surface of a sample and magnetic domain structure can be observed and a magnetic force microscope (MFM) can be used to observe stray fields near the surface of the sample, the distribution of electron (secondary electron) spin near the surface of a sample cannot be directly observed. In addition, with the magnetic field information measurement method and the magnetic field information measuring device 10 according to the embodiment of the present invention, optical resolution at 1 nm or less can be measured, and this cannot be measured using a conventional spin-polarized scanning tunneling microscope or magnetic force microscope or the magnetic Kerr effect.

With the magnetic field information measurement method and the magnetic field information measuring device 10 according to the embodiment of the present invention, it is possible to visualize and evaluate electron accumulation and the flow of electron spin by applying an external magnetic field and tracking the movement of electrons from nanoscale to microscale. As a result, it is possible to obtain basic knowledge on the interaction between electrons and material and therefore largely contribute to the development of spintronics devices that utilize the spin of electrons, such as magnetic sensors, magnetoresistive random-access memory (MRAM) and spin injection memory (STT-RAM). In addition, because optical resolution is high, the present invention can contribute to the determination of magnetic phenomena in minute regions at the atom level. The present invention can also be applied to biomaterial as an insulating material, and hence can also contribute to determining the relationship between the magnetic properties of biological tissue and cells and physiological function with nuclear magnetic resonance imaging (MRI).

REFERENCE SIGNS LIST

1: sample
2: secondary electron
3: magnetic field
10: magnetic field information measuring device
11: electron-beam hologram creation means
21: electron beam source
22: condenser lens
23: objective lens
24: biprism
24a: quartz glass wire
24b: ground electrode
12: magnetic field application means
13: magnetic field information acquisition means

What is claimed is:

1. A magnetic field information measurement method comprising:
   a first reconstructed phase image creation step of creating a first reconstructed phase image from a first electron-beam hologram that is created by causing an object wave comprised of an electron beam that is influenced by a sample and a reference wave comprised of an electron beam that is not influenced by the sample to interfere with each other under a state where a magnetic field has been applied to the sample;
   a second reconstructed phase image creation step of creating a second reconstructed phase image from a second electron-beam hologram that is created by causing an object wave comprised of an electron beam that is influenced by a sample and a reference wave comprised of an electron beam that is not influenced by the sample to interfere with each other under a state where a magnetic field has not been applied to the sample; and
   a magnetic field information acquisition step of obtaining magnetic field information indicating influence of the magnetic field on the sample on the basis of a difference between the first reconstructed phase image and the second reconstructed phase image, wherein:
   the sample includes a material that emits secondary electrons when irradiated with an electron beam;
   in the first reconstructed phase image creation step and the second reconstructed phase image creation step, the sample is irradiated with an electron beam to emit secondary electrons from the sample and the electron beam that passes through the sample is made to interfere with the reference wave as the object wave; and
   in the magnetic field information acquisition step, information indicating the influence of the magnetic field on the secondary electrons emitted from the sample is acquired as the magnetic field information.

2. The magnetic field information measurement method according to claim 1, wherein the sample is made of an insulating material.

3. A magnetic field information measuring device comprising:
   electron-beam hologram creation means provided to create an electron-beam hologram by causing an object wave comprised of an electron beam that is influenced by a sample and a reference wave comprised of an electron beam that is not influenced by the sample to interfere with each other;
   magnetic field application means provided to apply a magnetic field to the sample; and
   magnetic field information acquisition means provided to:
      create a first reconstructed phase image from a first electron-beam hologram that is created using the electron-beam hologram creation means under a state where a magnetic field has been applied to the sample using the magnetic field application means,
      create a second reconstructed phase image from a second electron-beam hologram that is created using the electron-beam hologram creation means under a state where a magnetic field is not applied to the sample, and
      determine the difference between the first reconstructed phase image and the second reconstructed phase image to acquire magnetic field information indicating influence of the magnetic field on the sample, wherein:
   the sample includes a material that emits secondary electrons when irradiated with an electron beam;
   in the creation of the first reconstructed phase image and the creation of the second reconstructed phase image, the sample is irradiated with an electron beam to emit secondary electrons from the sample and the electron beam that passes through the sample is made to interfere with the reference wave as the object wave; and
   the magnetic field information acquisition means acquires information indicating the influence of the magnetic field on the secondary electrons emitted from the sample, as the magnetic field information.

4. The magnetic field information measurement method according to claim 1, wherein, in the magnetic field information acquisition step, information indicating a spin movement of electrons in the sample or the secondary electrons emitted from the sample is acquired as the magnetic field information.

5. The magnetic field information measurement method according to claim 2, wherein, in the magnetic field information acquisition step, information indicating a spin movement of electrons in the sample or the secondary electrons emitted from the sample is acquired as the magnetic field information.

6. The magnetic field information measuring device according to claim 3, wherein the sample is made of an insulating material.

7. The magnetic field information measuring device according to claim 3, wherein the magnetic field information acquisition means acquires information indicating a spin movement of electrons in the sample or the secondary electrons emitted from the sample, as the magnetic field information.

8. The magnetic field information measuring device according to claim 6, wherein the magnetic field information acquisition means acquires information indicating a spin movement of electrons in the sample or the secondary electrons emitted from the sample, as the magnetic field information.

* * * * *